(12) United States Patent  (10) Patent No.: US 7,466,252 B1
Radulov et al.  (45) Date of Patent: Dec. 16, 2008

(54) METHOD AND APPARATUS FOR CALIBRATING A SCALED CURRENT ELECTRONIC CIRCUIT

(75) Inventors: Georgi I. Radulov, Eindhoven (NL); Patrick J. Quinn, Chapelizod (IE); Johannes A. Hegt, Rosmalen (NL); Arthur H. M. van Roermund, Helmond (NL)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/827,533

(22) Filed: Jul. 12, 2007

(51) Int. Cl.
*H03M 1/10* (2006.01)
(52) U.S. Cl. .................. 341/120; 341/144
(58) Field of Classification Search .............. 341/118, 341/120, 144, 135; 324/601; 330/254, 261
See application file for complete search history.

(56) References Cited

U.S. PATENT DOCUMENTS 5,446,455 A * 8/1995 Brooks ................ 341/145
5,642,116 A * 6/1997 Gersbach ............. 341/120
5,646,619 A * 7/1997 Daubert et al. ......... 341/118
7,076,384 B1   7/2006 Radulov et al.
7,312,732 B2 * 12/2007 Engl .................... 341/118

* cited by examiner

*Primary Examiner*—Peguy JeanPierre
(74) *Attorney, Agent, or Firm*—Michael T. Wallace

(57) ABSTRACT

A method and apparatus for the calibration of current cells, whereby a current signal from each current cell may be generated by either a thermometer current cell, or a binary current cell. If generated by a binary current cell, then two or more replica binary current cells exist to form a group of binary current cells within two or more binary current cell sets. The current magnitude generated by each replica current cell of each binary current cell group is first calibrated to be substantially equal to each other. Next, the combined current generated by the replica current cell group is calibrated to be substantially equal to a magnitude of a temporary current signal, or a portion thereof. Subsequent less-significant binary current cell groups are similarly calibrated to the temporary current signal through the use of the previously calibrated, more-significant binary current cell groups.

20 Claims, 12 Drawing Sheets

METHOD AND APPARATUS FOR CALIBRATING A SCALED CURRENT ELECTRONIC CIRCUIT

FIELD OF THE INVENTION

The present invention generally relates to the accurate generation of scaled currents, and more particularly, to a technique used for calibration of circuits for generation of scaled currents.

BACKGROUND OF THE INVENTION

The advent of the digital age established, and continues to create, advancements over analog design in such technological categories as computing, communications, and electronic recreation. Access to these technologies, therefore, is becoming increasingly affordable and realizable through digital innovation.

The digital age, however, has not obviated the need for analog circuitry. Consequently, both Analog to Digital Conversion (ADC) and Digital to Analog Conversion (DAC) technologies are very much in demand in order to bridge the gap between the analog and digital domains.

DAC technologies are required, for example, when digital information is required to control an analog component. Accordingly, control loops often incorporate digital computation circuitry to compare a reference signal with a generated signal in order to calculate a digital error between the two signals. Often, the digital error signal is then applied to an analog correction component, such as a Voltage Controlled Oscillator (VCO) or a Current Controlled Attenuator (CCA), to correct the error. As such, a DAC is then required to convert the digital error signal into an analog form suitable for use by the analog correction component.

Generally speaking, digital to analog conversion is accomplished through the scaling, e.g., division or multiplication, of a reference signal, e.g., voltage, current or charge, into quantized signal segments. Each segment may then be combined in response to an applied input code to form the analog output signal. For an ideal DAC, sequencing the input code from an all logic zero value to an all logic one value renders a rising (or falling) analog staircase waveform having equal magnitude steps, i.e., a monotonic waveform.

Once the monotonic waveform is smoothed, it forms a perfectly straight line having a constant slope at every point along the line. Each step of the staircase waveform represents a Least Significant Bit (LSB) having a magnitude equal to: $LSB=FSR/(2^M-1)$, where FSR is the Full Scale Range of the DAC output signal and M is the resolution of the DAC in bits.

For a non-ideal DAC, however, Differential Non-Linearities (DNL) and Integral Non-Linearities (INL) perturb the staircase waveform and thus adversely affect the linearity of the DAC. DNL, for example, affects the magnitude of each step, while INL affects the straightness of the staircase waveform when smoothed. Both parameters, therefore, contribute to the inaccuracy of the static code conversion and influence the quality of the dynamic analog output.

While design constraints for the DNL specification may be architecturally relaxed by employing thermometer or segmented structures, the INL specification is strongly coupled to the static errors of the analog components that generate the output signal. In order to counteract the static errors, two conventional approaches have been employed. First, an intrinsic DAC design approach is used, which employs large analog devices to reduce the static error to acceptable levels. Alternatively, a self-calibrating design approach is used, which employs additional error acquisition circuitry, calibration logic and operations, and error correction circuitry to improve the linearity.

In the self-calibrating design approach, a self-calibration technique is applied to each individual analog element that is used to produce the output signal, through the use of individual calibrating DACs (CALDACs), or biasing capacitors. The calibration scheme uses components that sense a difference between a reference and a calibrated element, such as through the use of a single-bit ADC, i.e., a comparator, or a multiple-bit ADC. However, the sensing components may cause problems due to their substantially unavoidable input offsets.

Conventional input offset cancellation techniques are then employed, whereby the signal being calibrated and the reference signal are applied to the inputs of an ADC during a first measurement. The inputs are then swapped, a second measurement is taken, and a mean value is calculated from the first and second measurements. Such a cancellation approach, however, places stringent accuracy requirements on both the measurement components and the calibrating elements.

Still other calibration techniques involve the calibration of only one type of current cell, e.g., the thermometer current cells of a thermometer DAC architecture, or segmented DAC architecture, such as the calibration method disclosed in Radulov et al., U.S. Pat. No. 7,076,384, issued Jul. 11, 2006, which is incorporated herein by reference in its entirety. The calibration method disclosed in Radulov institutes a two-part calibration, whereby a temporary signal is first calibrated to a reference signal and the main signal to be calibrated is then calibrated to the temporary signal. In addition, the sign of the quantization error is controlled during the two-part calibration, so as to minimize quantization error effects on the calibration. Such a calibration method, however, exploits the fact that all thermometer current cells to be calibrated are nominally equivalent to each other and thus, does not facilitate calibration of the non-equivalent, binary current cells that exist in a binary, or segmented architecture.

Efforts continue, therefore, to provide calibration techniques for all current cells of a current steering architecture, whether the current steering architecture employs thermometer, binary, or segmented current cell combinations. Such a calibration technique would be substantially free of any input offset error caused by the measurement ADC, since all DAC current cells would be calibrated. In addition, it is believed that the advantages of calibrating all DAC current cells also include: improved portability of the current-based circuit, e.g. DAC design, into other silicon technologies; improved overall accuracy and reduced sensitivity to manufacturing tolerances; improved chip yield, etc.

SUMMARY OF THE INVENTION

To overcome limitations in the prior art, and to overcome other limitations that will become apparent upon reading and understanding the present specification, the present invention discloses an apparatus and method for calibrating all current cells within a binary, thermometer, or segmented digital to analog converter (DAC) architecture.

In accordance with one embodiment of the invention, a self-calibrating digital to analog converter comprises two or more sets of programmable current cells that are programmably coupled to a first node. The self-calibrating digital to analog converter further comprises a temporary current cell that is programmably coupled to the first node, a least significant bit current cell that is programmably coupled to the first node, and a calibration logic block that is programmably coupled to the first node.

In accordance with another embodiment of the invention, a current calibration method comprises configuring at least two current cells from at least two sets of current cells to form at least one group of replica current cells, adjusting a magnitude of current generated by each current cell in the at least one group of replica current cells to be substantially equal to each other, and adjusting a magnitude of current generated by each of the at least one group of replica current cells to be substantially equal to a portion of a temporary current magnitude.

In accordance with another embodiment of the invention, a method of calibrating binary current cells within a digital to analog converter comprises configuring at least two binary current cells from at least two sets of binary current cells to form at least one group of replica binary current cells. Each group of replica binary current cells forms a binary weighted bit of the digital to analog converter. The method of calibrating binary current cells within a digital to analog converter further comprises adjusting a magnitude of current generated by each binary current cell in the at least one group of replica binary current cells to be substantially equal to each other, and adjusting a magnitude of current generated by each of the at least one group of replica binary current cells to be substantially equal to a portion of a temporary current conducted by a previously calibrated temporary current cell.

BRIEF DESCRIPTION OF THE DRAWINGS

Various aspects and advantages of the invention will become apparent upon review of the following detailed description and upon reference to the drawings in which.

DETAILED DESCRIPTION

Generally, the present invention is applied to the calibration of current cells, i.e., current sources and/or current sinks, whereby a current signal, e.g., $I_a$, is calibrated either to a reference current signal, e.g., $I_{ref}$, or to a portion of a reference current signal, e.g., $I_{ref}$. Current signal $I_a$ may be generated by either a thermometer current source or sink, or a binary current source or sink.

If generated by a binary current source/sink, then the binary current source/sink should have at least two nominally identical replicas. The current generated by each replica is calibrated, whereby the calibrated current generated by the first current source/sink replica is substantially equal to the calibrated current generated by the second current source/sink replica. Further, the sum of both current source/sink replicas is calibrated to be substantially equal to one half of either a more significant, previously calibrated current source/sink or the reference current $I_{ref}$. Subsequent less significant binary current sources/sinks are similarly calibrated to the reference current through the use of the current sources/sinks of the previously calibrated, more significant binary current sources/sinks.

Figure 1:
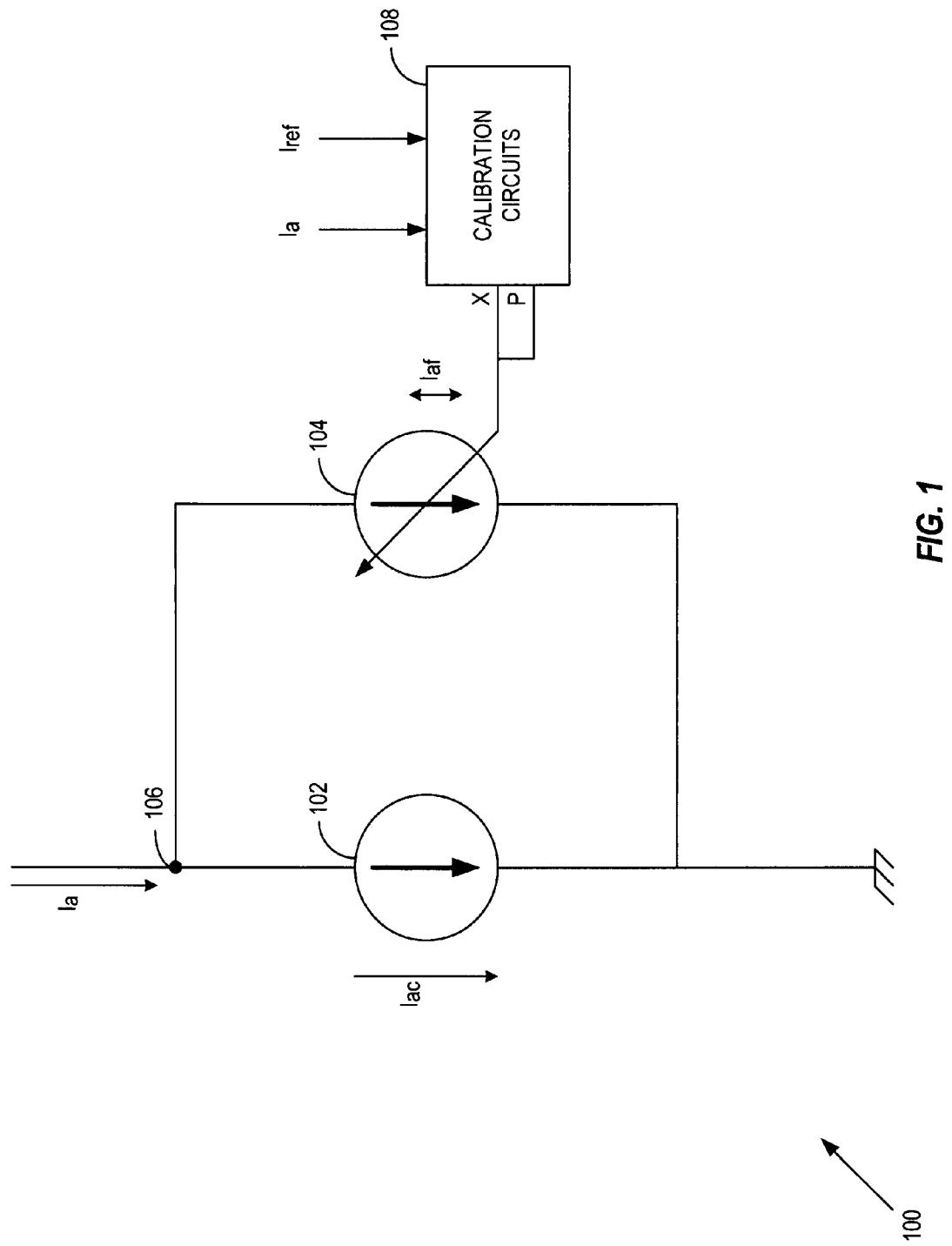
FIG. 1 exemplifies a self-calibrating, current calibration block diagram.

FIG. 1 represents self-calibration block diagram 100, whereby current $I_a$ is constructed at node 106 by using a combination of a coarse current, $I_{ac}$, and a fine current, $I_{af}$, such that: $I_a = I_{ac} + I_{af}$. Coarse current $I_{ac}$ is generated by coarse current source 102, while fine current $I_{af}$ is generated by a discrete, programmable current source, e.g., calibrating digital to analog converter (CALDAC) 104.

The current generated by current source 104 is controlled by calibration logic 108 via digital word, X, and polarity indicator, P, to indicate whether digital word X is positive (P=0) or negative (P=1), i.e., P is indicative of the direction of current $I_{af}$. It should be noted that while coarse current source 102 is generally depicted as a non-programmable current source, those of ordinary skill in the art will recognize that programmable current sources may also be used to implement coarse current source 102.

In one embodiment, calibration logic 108 generates control signals X and P to produce current $I_{af}$ such that:

$I_{af} = (-1)^P * X * I_{afLSB}$, where $I_{afLSB}$ is the LSB step size of current source 104, X is the value of the digital word, and P is the polarity bit indicating the direction of current $I_{af}$. Current $I_a$ is then compared to reference current, $I_{ref}$, where $I_a$ is adjusted via fine current $I_{af}$ to be substantially equal to reference current $I_{ref}$ within a quantization error. In addition, the polarity, P, of the current difference between $I_{ref}$ and $I_a$ is sensed by a current comparator, e.g. a sign detector, (not shown) within calibration circuits block 108 so that digital word X may remain positive.

The calibration routine may be commenced without a reset, whereby the calibration routine may initiate from any random value of X and P, such that current $I_{af}$ has any initial magnitude and direction. A comparison is made between the current being tuned, e.g., $I_a$, and the reference current, e.g., $I_{ref}$. A 1-bit information result of the comparison is used to determine the required polarity of the correction current, $I_{af}$. The magnitude and direction of the correction current, $I_{af}$, may then be adjusted in accordance with one of four conditions obtained when comparing the 1-bit information result to the polarity bit, P.

A first condition yields a comparison result of 0, which coincides with the present value of the polarity bit, i.e., P=0, resulting in an increased magnitude of $I_{af}$. A second condition yields a comparison result of 0, which does not coincide with the present value of the polarity bit, i.e., P=1, resulting in a decreased magnitude of $I_{af}$. A third condition yields a comparison result of 1, which coincides with the present value of the polarity bit, i.e., P=1, resulting in an increased magnitude of $I_{af}$. A fourth condition yields a comparison result of 1, which does not coincide with the present value of the polarity bit, i.e., P=0, resulting in a decreased magnitude of $I_{af}$.

That is to say, in other words, that digital word X is incremented if P coincides with the required polarity for the correction of $I_a$. Further, digital word X is decremented if P does not coincide with the required polarity for the correction of $I_a$. Either condition may result in an $I_{af/LSB}$ increase in $I_a$, or an $I_{af/LSB}$ decrease in $I_a$. If the digital word X should be decremented and X is 0, then P is inverted and X is incremented.

After adjustment of digital word X, another comparison of current $I_a$ and $I_{ref}$ is made, whereby $I_a$ is considered to be fine tuned if the 1-bit comparison changes from the previous comparison result. Otherwise, if no change occurs, then digital word, X, is either incremented or decremented and followed by another comparison. If digital word, X, is 0 and it should be decremented, then P is inverted and X is incremented and then followed by another comparison. The process is repeated until the comparison result of the present iteration differs from the previous comparison result.

That is to say, in other words, that current $I_a$ is considered to be fine tuned when the logic value at the comparator output either toggles from a logic zero to a logic one, or from a logic one to a logic zero, between subsequent comparisons. Once fine tuned, calibrated current $I_a$ is substantially equal to $I_{ref}$, which is to say that calibrated current $I_a$ is equal to current $I_{ref}$ to within the quantization error that is due to the discrete nature of current source 104.

As discussed above, the calibration method utilizes a current comparator, i.e. a sign detector, to sense a difference between the current being fine tuned, e.g., $I_a$, and the reference current, e.g., $I_{ref}$. $I_a$ may be generated by a thermometer current source/sink, a set of binary current sources/sinks, or both. Accordingly, the calibration process may be implemented in three separate phases, phase A (ΦA), phase B (ΦB), and phase C (ΦC), where each subsequent tuning phase utilizes calibration results of the previous tuning phase.

Figure 2A:
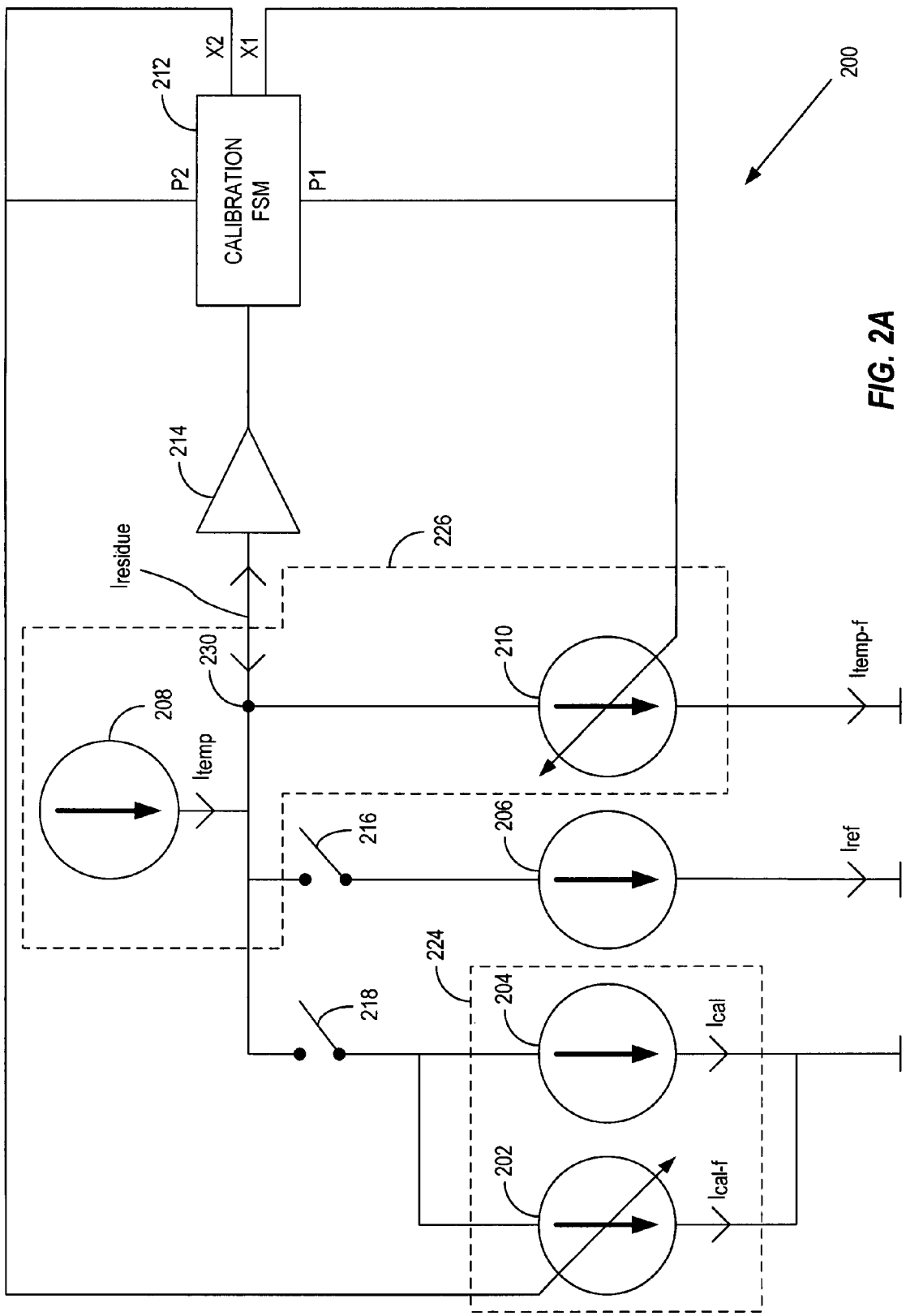
FIG. 2A illustrates an exemplary calibration schematic diagram useful in the calibration of both thermometer and binary current sources/sinks.

Turning to FIG. 2A, an exemplary calibration block diagram 200 is exemplified that may be used to calibrate thermometer and/or binary current sources/sinks of a current steering DAC for any level of segmentation. Self-calibrating current sink 224 operates as discussed above in relation to the self-calibration block diagram 100 of FIG. 1. It should be noted, however, that self-calibrating current sink 224 may be comprised of CALDAC 202 in parallel with a thermometer current sink and/or a set of binary current sinks.

Given that calibration block diagram 200 is used with a segmented DAC architecture, self-calibrating current sink 224 may be comprised of CALDAC 202 in parallel with either a thermometer current sink, or with a set of binary current sinks. As discussed in more detail below, the total nominal sum current conducted by the set of the binary current sinks is calibrated to be substantially equal to the current conducted by the thermometer current sink.

Given that calibration block diagram 200 is used with a fully binary DAC architecture, on the other hand, self-calibrating current sink 224 may be comprised of CALDAC 202 in parallel with either the most-significant binary current sink, or with a set of binary current sinks. As discussed in more detail below, the total nominal sum current conducted by the set of binary current sinks is calibrated to be substantially equal to the current conducted by the most-significant binary current sink. It can be seen, therefore, that current steering architectures employing thermometer and/or binary current source/sinks may be calibrated.

During ΦA, switch 216 is closed and switch 218 is opened to enable the calibration of current cell 226 to reference current sink 206. In particular, the current at node 230 is comprised of: current $I_{temp}$ flowing into node 230; current $I_{ref}$ flowing from node 230; current $I_{temp-f}$ which either flows into, or from, node 230 depending upon the logic value of P1; and current $I_{residue}$, which either flows into, or from, node 230.

Thus, the current equation at node 230 can be written as follows:

$$I_{temp} - I_{ref} +/- I_{temp-f} = +/- I_{residue}, \quad (1)$$

where $I_{temp-f}$ is a bidirectional current generated by CALDAC 210 in response to control word X1 and P1, and $I_{residue}$ is a bidirectional current whose magnitude is sought to be minimized by the calibration algorithm. In particular, once calibrated, equation (1) may be rewritten as follows:

$$I_{temp} +/- I_{temp-f} \approx I_{ref}, \quad (2)$$

where the magnitude of current $I_{residue}$ is reduced to near zero, i.e., within the quantization error, and the sum of current $I_{temp}$ and $I_{temp-f}$ is substantially equal to $I_{ref}$ within the quantization error.

The calibration algorithm of ΦA iteratively increments or decrements control word X1, whereby after each increment/decrement, the logic value at the output of comparator, i.e., sign detector, 214 is assessed by finite state machine (FSM) 212 to ultimately minimize current $I_{residue}$. In particular, the magnitude of current $I_{temp-f}$ is either increased, or decreased, to satisfy equation (2).

For example, if the initial magnitude of current $I_{temp}$ is larger than the magnitude of current $I_{ref}$, then current $I_{residue}$ is initially flowing from node 230, which causes the output of sign detector 214 to indicate a logic 1. If the initial value of P1 is also equal to a logic 1, i.e., the initial value of P1 coincides with the first decision of sign detector 214, then FSM 212 increases the magnitude of current $I_{temp-f}$ flowing from node 230, by incrementing control word X1, until the output of sign detector 214 indicates a logic 0, thus indicating that current $I_{residue}$ changed from flowing out of node 230 to flowing into node 230.

If, on the other hand, the initial value of P1 is equal to a logic 0, i.e., the initial value of P1 does not coincide with the first decision of sign detector 214, then FSM 212 decreases the magnitude of current $I_{temp-f}$ flowing into node 230, by decrementing control word X1. The magnitude of $I_{temp-f}$ is decreased until the output of sign detector 214 indicates a logic 0, thus indicating that current $I_{residue}$ changed from flowing out of node 230 to flowing into node 230. If X1 reaches a logic value of 0 during the process of decreasing the magnitude of $I_{temp-f}$, then P1 is inverted and the process continues by incrementing X1 until the output of sign detector 214 indicates a logic 0, thus indicating that current $I_{residue}$ changed from flowing out of node 230 to flowing into node 230. The magnitude and polarity of the current produced by CALDAC 210 is then recorded by FSM 212 and later used during calibration of self-calibrating current cell 224.

If the initial magnitude of current $I_{temp}$ is smaller than the magnitude of current $I_{ref}$, then current $I_{residue}$ is initially flowing into node 230, which causes the output of sign detector 214 to indicate a logic 0. If the initial value of P1 is also equal to a logic 0, i.e., the initial value of P1 coincides with the first decision of sign detector 214, then FSM 212 increases the magnitude of current $I_{temp-f}$ flowing into node 230, by incrementing control word X1, until the output of sign detector 214 indicates a logic 1, thus indicating that current $I_{residue}$ changed from flowing into node 230 to flowing out of node 230.

If, on the other hand, the initial value of P1 is equal to a logic 1, i.e., the initial value of P1 does not coincide with the first decision of sign detector 214, then FSM 212 decreases the magnitude of current $I_{temp-f}$ flowing out of node 230, by decrementing control word X1. The magnitude of $I_{temp-f}$ is decreased until the output of sign detector 214 indicates a logic 1, thus indicating that current $I_{residue}$ changed from flowing into node 230 to flowing out of node 230. If X1 reaches a logic value of 0 during the process of decreasing the magnitude of $I_{temp-f}$, then P1 is inverted and the process continues by incrementing X1 until the output of sign detector 214 indicates a logic 1, thus indicating that current $I_{residue}$ changed from flowing into node 230 to flowing out of node 230. The magnitude and polarity of the current produced by CALDAC 210 is then recorded by FSM 212 and later used during calibration of self-calibrating current cell 224.

During ΦB, switch 216 is opened and switch 218 is closed, thus removing current source 206 and associated reference current, $I_{ref}$, from the calibration circuit. In its place, self-calibrating current cell 224 is coupled to node 230. As discussed above, self-calibrating current cell 224 may include a thermometer current sink and/or a set of binary current sinks. In either case, CALDAC 202 is utilized to calibrate current cell 224 to current cell 226 after the calibration of current cell 226 in ΦA.

The calibration algorithm of ΦB iteratively increments or decrements control word X2, whereby after each increment or decrement, the logic value at the output of sign detector 214 is assessed by finite state machine (FSM) 212 to ultimately minimize current $I_{residue}$. In particular, the magnitude of current $I_{cal-f}$ is either increased, or decreased, to satisfy the following equation:

$$I_{cal} +/- I_{cal-f} \approx I_{temp} +/- I_{temp-f} = I_{226}, \quad (3)$$

where $I_{cal}$ is the current generated by current sink 204, $I_{cal-f}$ is the current generated by CALDAC 202, and $I_{226}$ is the post-calibrated current signal generated by current cell 226 as calibrated in ΦA. Current signal, $I_{226}$, is hereinafter referred to as the post-calibrated current, $I_{temp}$.

For example, if the initial magnitude of current $I_{cal}$ is larger than the magnitude of current $I_{temp}$, then current $I_{residue}$ is initially flowing into node 230, which causes the output of sign detector 214 to indicate a logic 0. If the initial value of P2 is also equal to a logic 0, i.e., the initial value of P2 coincides with the first decision of sign detector 214, then FSM 212 increases the magnitude of current $I_{cal-f}$ flowing into node 230, by incrementing control word X2, until the output of sign detector 214 indicates a logic 1, thus indicating that current $I_{residue}$ changed from flowing into node 230 to flowing out of node 230.

If, on the other hand, the initial value of P2 is equal to a logic 1, i.e., the initial value of P2 does not coincide with the first decision of sign detector 214, then FSM 212 decreases the magnitude of current $I_{cal-f}$ flowing from node 230, by decrementing control word X2. The magnitude of $I_{cal-f}$ is decreased until the output of sign detector 214 indicates a logic 1, thus indicating that current $I_{residue}$ changed from flowing into node 230 to flowing out of node 230. If X2 reaches a logic value of 0 during the process of decreasing the magnitude of $I_{cal-f}$, then P2 is inverted and the process continues by incrementing X2 until the output of sign detector 214 indicates a logic 1, thus indicating that current $I_{residue}$ changed from flowing into node 230 to flowing out of node 230.

If the initial magnitude of current $I_{cal}$ is smaller than the magnitude of current $I_{temp}$, then current $I_{residue}$ is initially flowing out of node 230, which causes the output of sign detector 214 to indicate a logic 1. If the initial value of P2 is also equal to a logic 1, i.e., the initial value of P2 coincides with the first decision of sign detector 214, then FSM 212 increases the magnitude of current $I_{cal-f}$ flowing out of node 230, by incrementing control word X2, until the output of sign detector 214 indicates a logic 0, thus indicating that current $I_{residue}$ changed from flowing out of node 230 to flowing into node 230.

If, on the other hand, the initial value of P2 is equal to a logic 0, i.e., the initial value of P2 does not coincide with the first decision of sign detector 214, then FSM 212 decreases the magnitude of current $I_{cal-f}$ flowing into node 230, by decrementing control word X2. The magnitude of $I_{cal-f}$ is decreased until the output of sign detector 214 indicates a logic 0, thus indicating that current $I_{residue}$ changed from flowing out of node 230 to flowing into node 230. If X2 reaches a logic value of 0 during the process of decreasing the magnitude of $I_{cal-f}$, then P2 is inverted and the process continues by incrementing X2 until the output of sign detector 214 indicates a logic 0, thus indicating that current $I_{residue}$ changed from flowing out of node 230 to flowing into node 230.

Figure 2B:
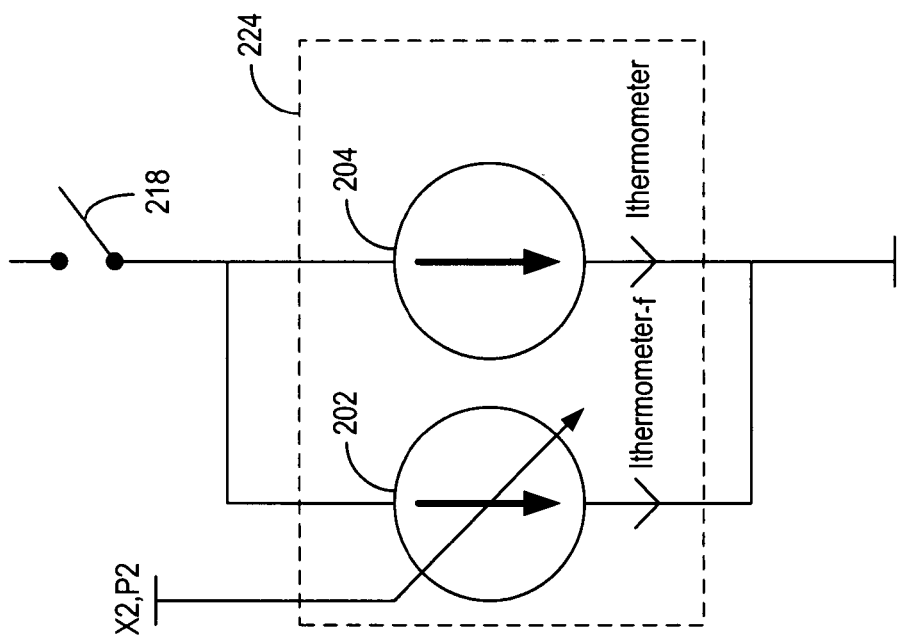
FIG. 2B exemplifies a portion of the schematic diagram of FIG. 2A that is active during the calibration of thermometer current sources/sinks.

As discussed above, self-calibrating current sink 224 may be comprised of CALDAC 202 in parallel with a thermometer current sink. Turning to FIG. 2B, such an implementation is exemplified, whereby a given DAC application may utilize a plurality of nominally identical thermometer current sinks 204. Calibration of the plurality of nominally identical thermometer current sinks 204 may be achieved through appropriate adjustment of CALDACs 202 as discussed above in relation to FIG. 2A.

Self-calibrating current sink 224 may also be comprised of multiple binary current cell sets $224_a$, $224_b$, etc., where each bit of a binary current cell set comprises a CALDAC $202(M)_x$ in parallel with a binary current sink $204(M)_x$. M is defined to represent the particular binary bit of the binary current cell set and x denotes the particular binary current cell set. Calibration of binary current sinks $204(M)_x$ is discussed below in relation to FIGS. 2C-2H, whereby only partial schematic diagrams are exemplified so as to facilitate explanation.

Figure 2C:
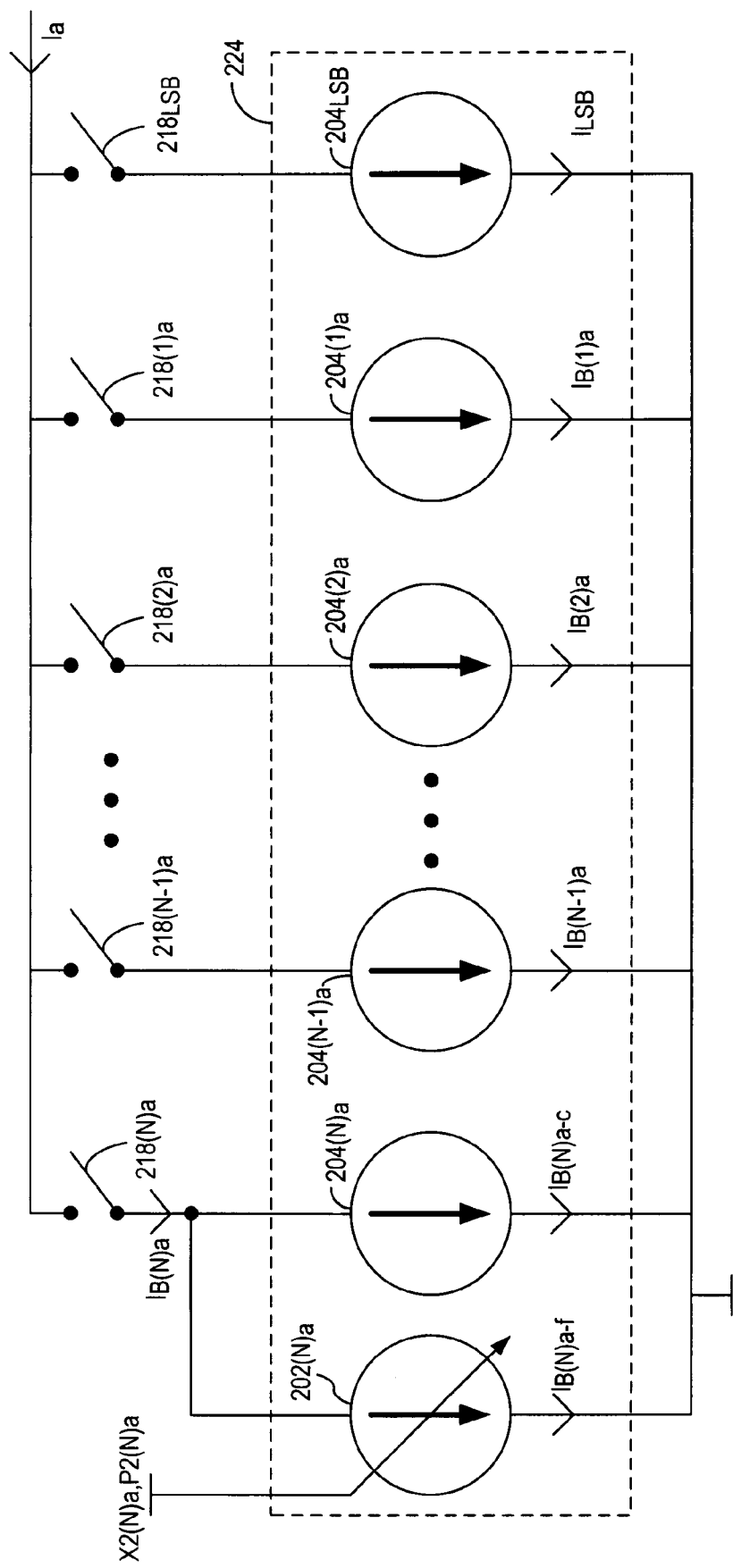
FIG. 2C exemplifies a portion of the schematic diagram of FIG. 2A that is active during the calibration of a first replica current sink of the most significant bit of a set of binary current sources/sinks.

Turning to FIG. 2C, a partial schematic diagram is illustrated, whereby a single binary current cell set, 224, is exemplified. Further, CALDAC $202(N)_a$, which is representative of the most significant bit CALDAC for binary current cell set $224_a$, is the only CALDAC illustrated. It is understood, however, that each binary current sink of each binary current cell set includes a CALDAC $202(M)_x$.

As discussed in more detail below, each current sink within current sink set 224 may be calibrated in a succession of calibration steps. In the first calibration step, switches $218(N)_a$, $218(N-1)_a$, ..., $218(2)_a$, $218(1)_a$, and $218_{LSB}$ are closed. The current to be fine tuned, $I_a$, is therefore, composed of the sum of the current generated by current sinks $204(N)_a$, $204(N-1)_a$, ... $204(2)_a$, $204(1)_a$, $204_{LSB}$, and CALDAC current sink $202(N)_a$, where the nominal magnitude of the sum of the current is substantially equal to the previously calibrated current $I_{temp}$. $I_a$ is fine tuned to be substantially equal to $I_{temp}$, as discussed above in relation to current cell 224 of FIG. 2A, through appropriate adjustment of CALDAC $202(N)_a$, which results in the following equation within the quantization calibration error:

$$I_{B(N)a} + I_{B(N-1)a} + \ldots + I_{B(2)a} + I_{B(1)a} + I_{LSB} = I_{temp}, \quad (4)$$

or solving for $I_{B(N)a}$, $$I_{B(N)a} = I_{temp} - I_{B(N-1)a} - \ldots - I_{B(2)a} - I_{B(1)a} - I_{LSB}. \quad (5)$$

Figure 2D:
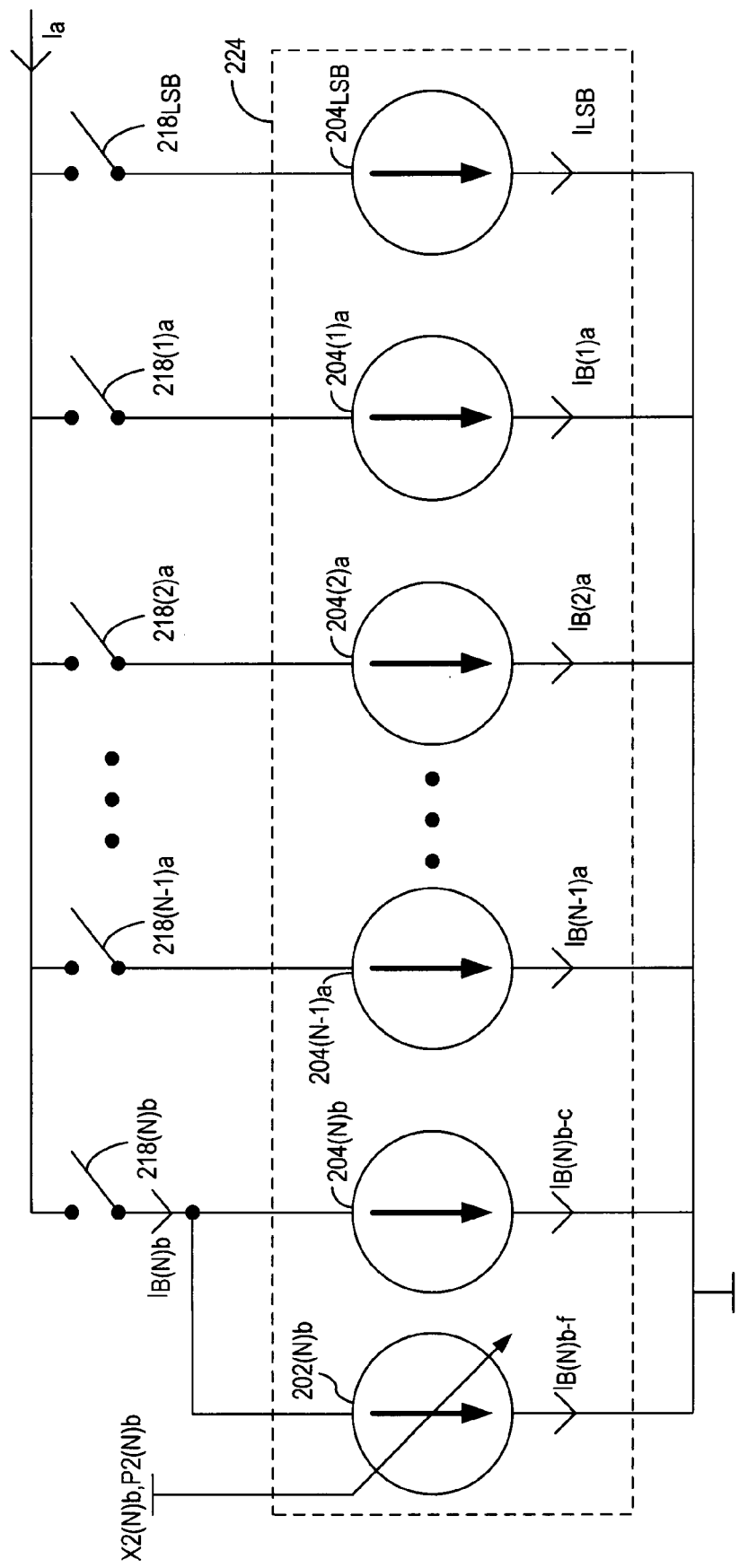
FIG. 2D exemplifies a portion of the schematic diagram of FIG. 2A that is active during the calibration of a second replica current sink of the most significant bit of a set of binary current sources/sinks.

Turning to FIG. 2D, the relevant components active during the second calibration step are illustrated, whereby switches $218(N)_b$, $218(N-1)_a$, ..., $218(2)_a$, $218(1)_a$, and $218_{LSB}$ are closed. The current to be fine tuned, $I_a$, is therefore, composed of the sum of the current generated by current sink $204(N)_b$, current sinks $204(N-1)_a$, ... $204(2)_a$, $204(1)_a$, $204_{LSB}$, and CALDAC current sink $202(N)_b$, where the nominal magnitude of the sum of the current is substantially equal to the previously calibrated current $I_{temp}$. $I_a$ is fine tuned to be substantially equal to $I_{temp}$, as discussed above in relation to current cell 224 of FIG. 2A, through appropriate adjustment of CALDAC $202(N)_b$, which results in the following equation within the quantization calibration error:

$$I_{B(N)b} + I_{B(N-1)a} + \ldots + I_{B(2)a} + I_{B(1)a} + I_{LSB} = I_{temp}, \quad (6)$$

or solving for $I_{B(N)b}$, $$I_{B(N)b} = I_{temp} - I_{B(N-1)a} - \ldots - I_{B(2)a} - I_{B(1)a} - I_{LSB}. \quad (7)$$

Thus, once the first and second calibration steps have been completed, it can be concluded from equations (5) and (7), that $I_{B(N)a}$ and $I_{B(N)b}$ are equal as in equation (8):

$$I_{B(N)a} = I_{B(N)b} = I_{temp} - I_{B(N-1)a} - \ldots - I_{B(2)a} - I_{B(1)a} - I_{LSB}. \quad (8)$$

Figure 2E:
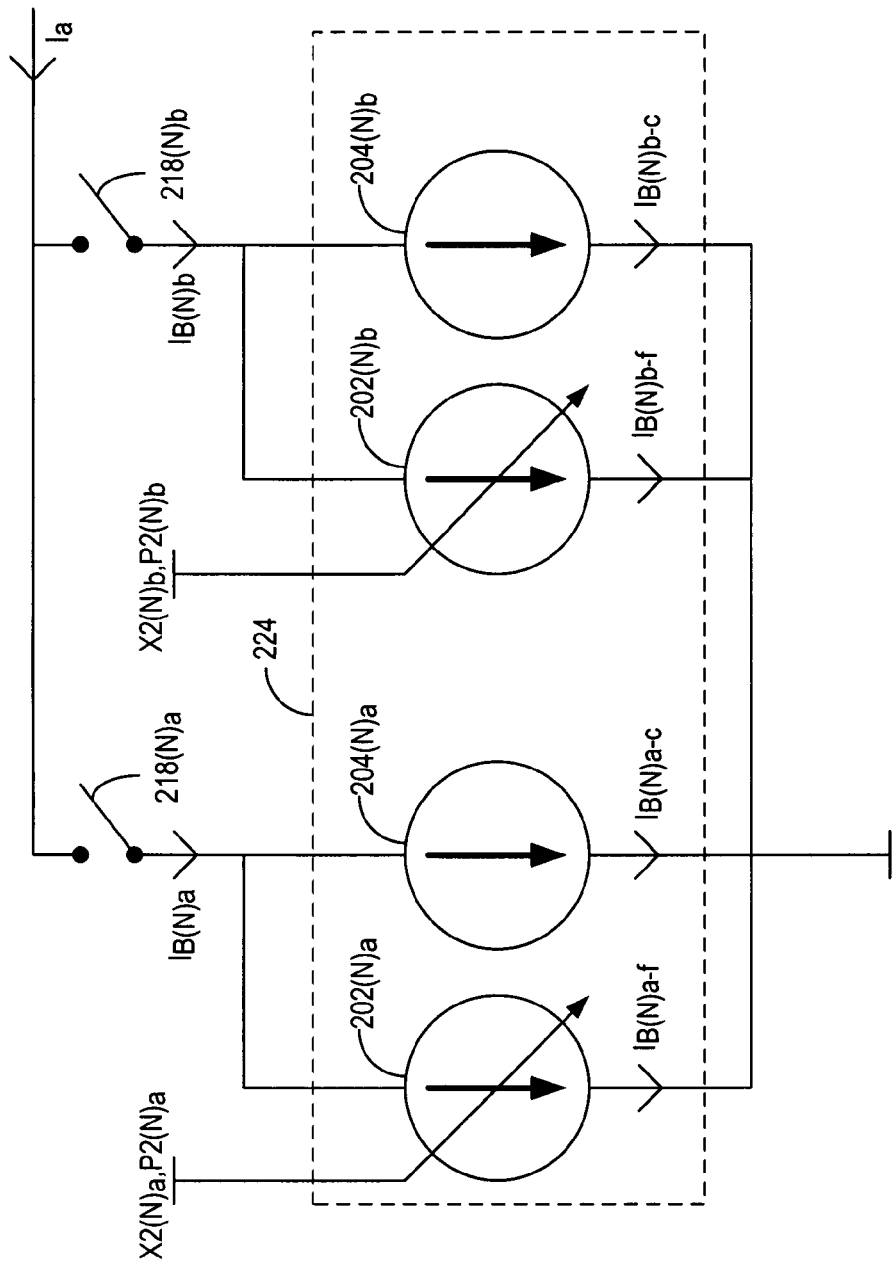
FIG. 2E exemplifies a portion of the schematic diagram of FIG. 2A that is active during the calibration of first and second replica current sinks of the most significant bit of a set of binary current sources/sinks.

Turning to FIG. 2E, the relevant components active during the third calibration step are illustrated, whereby switches $218(N)_a$ and $218(N)_b$ are closed. The current to be fine tuned, $I_a$, is therefore, composed of the sum of the current generated by current sinks $204(N)_a$, $204(N)_b$, and CALDAC current sinks $202(N)_a$, $202(N)_b$, where the nominal magnitude of the sum of the current is substantially equal to $I_{temp}$. $I_a$ is fine tuned to be substantially equal to $I_{temp}$, as discussed above in relation to current cell 224 of FIG. 2A, through simultaneously adjusting CALDACs $202(N)_a$ and $202(N)_b$, which results in the following equation within the quantization calibration error:

$$I_{B(N)a} + I_{B(N)b} = I_{temp}. \quad (9)$$

From equations (5), (7), and (9), the following relationship may be established:

$$I_{B(N)b} = I_{B(N)a} = 0.5 * I_{temp}. \quad (10)$$

Thus, after completion of the first three calibration steps, the current conducted by the two most significant binary current sink replicas, $204(N)_a$, $204(N)_b$, are calibrated to be substantially equal to $I_{temp}/2$ within a quantization calibration error. The magnitude and polarity of the current produced by CALDACs $202(N)_a$ and $202(N)_b$, as represented by control signals $X2(N)_a$, $P2(N)_a$ and $X2(N)_b$, $P2(N)_b$, are then recorded by FSM 212 and later used during calibration of the remaining binary current sinks within self-calibrating current sink 224.

Figure 2F:
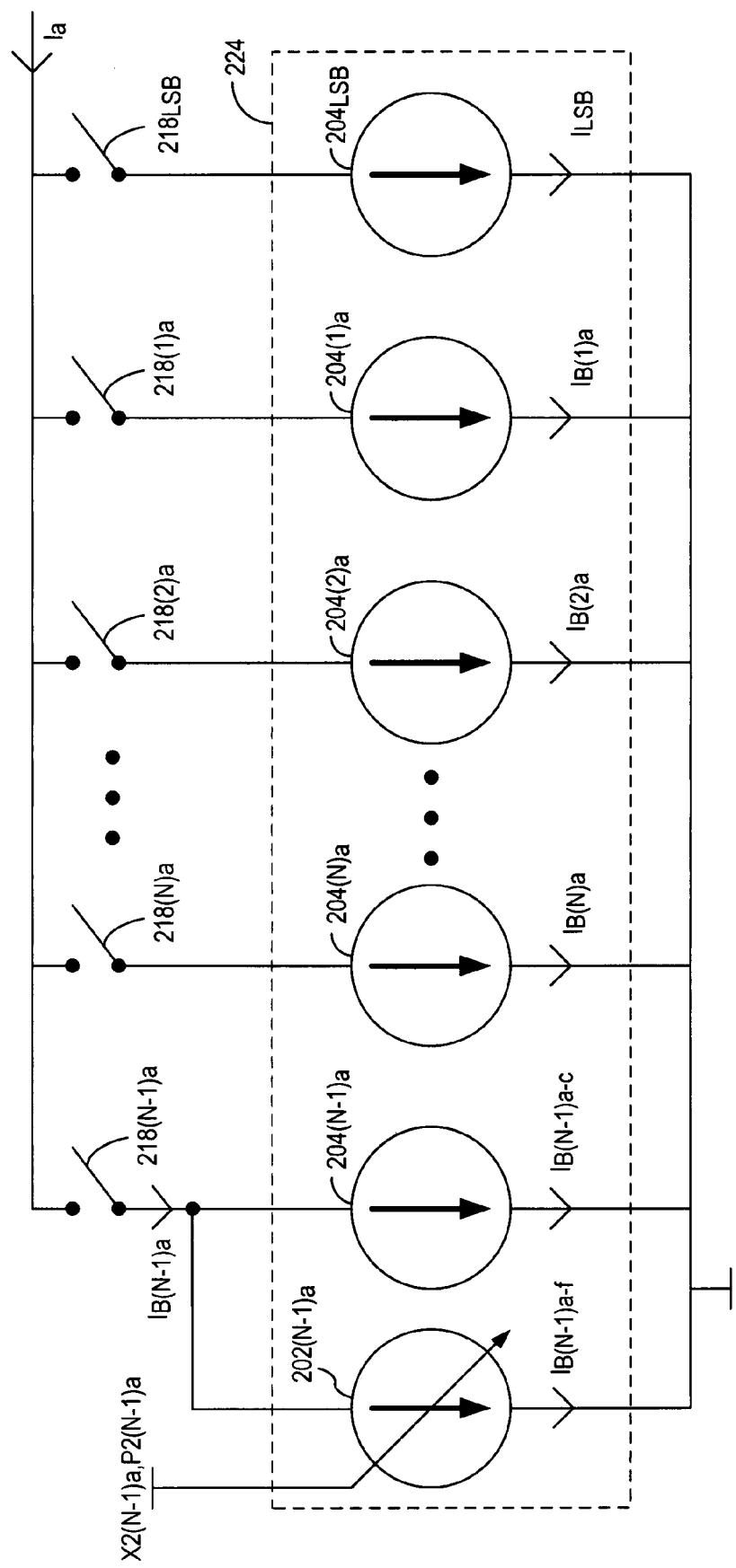
FIG. 2F exemplifies a portion of the schematic diagram of FIG. 2A that is active during the calibration of a first replica current sink of the next most significant bit of a set of binary current sources/sinks.

Turning to FIG. 2F, the relevant components active during the fourth calibration step are illustrated, whereby CALDAC $202(N-1)_a$, which is representative of the next least significant bit CALDAC for binary current cell set 224, is the only CALDAC illustrated. It should be noted that the most significant current sink, $204(N)_a$, previously calibrated as discussed above, is also active during the next three calibration steps.

In the fourth calibration step, switches $218(N-1)_a$, ..., $218(2)_a$, $218(1)_a$, and $218_{LSB}$ are closed. In addition, switch $218(N)_a$ is closed so that the previously calibrated current, $I_B(N)_a$, is included in the current to be fine tuned, $I_a$. $I_a$ is, therefore, composed of the sum of the current generated by current sinks $204(N)_a$, $204(N-1)_a$, ... $204(2)_a$, $204(1)_a$, $204_{LSB}$, and CALDAC current sink $202(N-1)_a$, where the nominal magnitude of the sum of the current is substantially equal to the previously calibrated current $I_{temp}$. $I_a$ is fine tuned to be substantially equal to $I_{temp}$, as discussed above in relation to current cell 224 of FIG. 2A, through appropriate adjustment of CALDAC $202(N-1)_a$, which results in the following equation within the quantization calibration error:

$$I_{B(N)a} + I_{B(N-1)a} + \ldots + I_{B(2)a} + I_{B(1)a} + I_{LSB} = I_{temp}, \quad (11)$$

or solving for $I_{B(N-1)a}$, $$I_{B(N-1)a} = I_{temp} - I_{B(N)a} - \ldots - I_{B(2)a} - I_{B(1)a} - I_{LSB}. \quad (12)$$

Figure 2G:
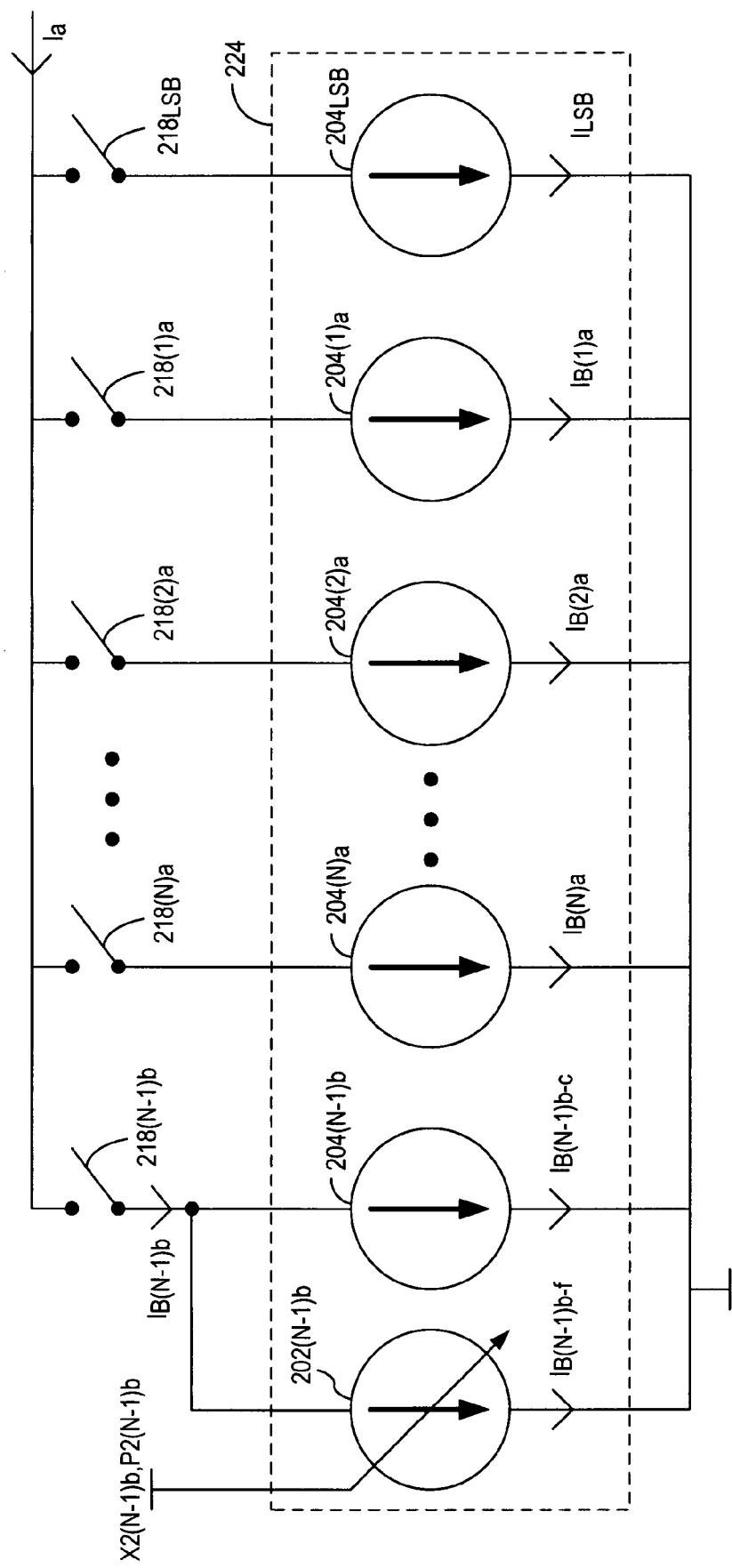
FIG. 2G exemplifies a portion of the schematic diagram of FIG. 2A that is active during the calibration of a second replica current sink of the next most significant bit of a set of binary current sources/sinks.

Turning to FIG. 2G, the relevant components active during the fifth calibration step are illustrated, whereby switches $218(N-1)_b$, $218(N)_a$, ..., $218(2)_a$, $218(1)_a$, and $218_{LSB}$ are closed. Switch $218(N)_a$ is closed so that the previously calibrated current, $I_B(N)_a$, is included in the current to be fine tuned, $I_a$. $I_a$ is, therefore, composed of the sum of the current generated by current sinks $204(N)_a$, $204(N-1)_b$, ... $204(2)_a$, $204(1)_a$, $204_{LSB}$, and CALDAC current sink $202(N-1)_b$, where the nominal magnitude of the sum of the current is substantially equal to the previously calibrated current $I_{temp}$. $I_a$ is fine tuned to be substantially equal to $I_{temp}$, as discussed above in relation to current cell 224 of FIG. 2A, through appropriate adjustment of CALDAC $202(N-1)_b$, which results in the following equation within the quantization calibration error:

$$I_{B(N)a} + I_{B(N-1)b} + \ldots + I_{B(2)a} + I_{B(1)a} + I_{LSB} = I_{temp}, \quad (13)$$

or solving for $I_{B(N-1)b}$, $$I_{B(N-1)b} = I_{temp} - I_{B(N)a} - \ldots - I_{B(2)a} - I_{B(1)a} - I_{LSB}. \quad (14)$$

Thus, once the fourth and fifth calibration steps have been completed, it can be concluded from equations (12) and (14), that $I_{B(N-1)a}$ and $I_{B(N-1)b}$ are equal as in equation (15):

$$I_{B(N-1)a} = I_{B(N-1)b} = I_{temp} - I_{B(N)a} - \ldots - I_{B(2)a} - I_{B(1)a} - I_{LSB}. \quad (15)$$

Figure 2H:
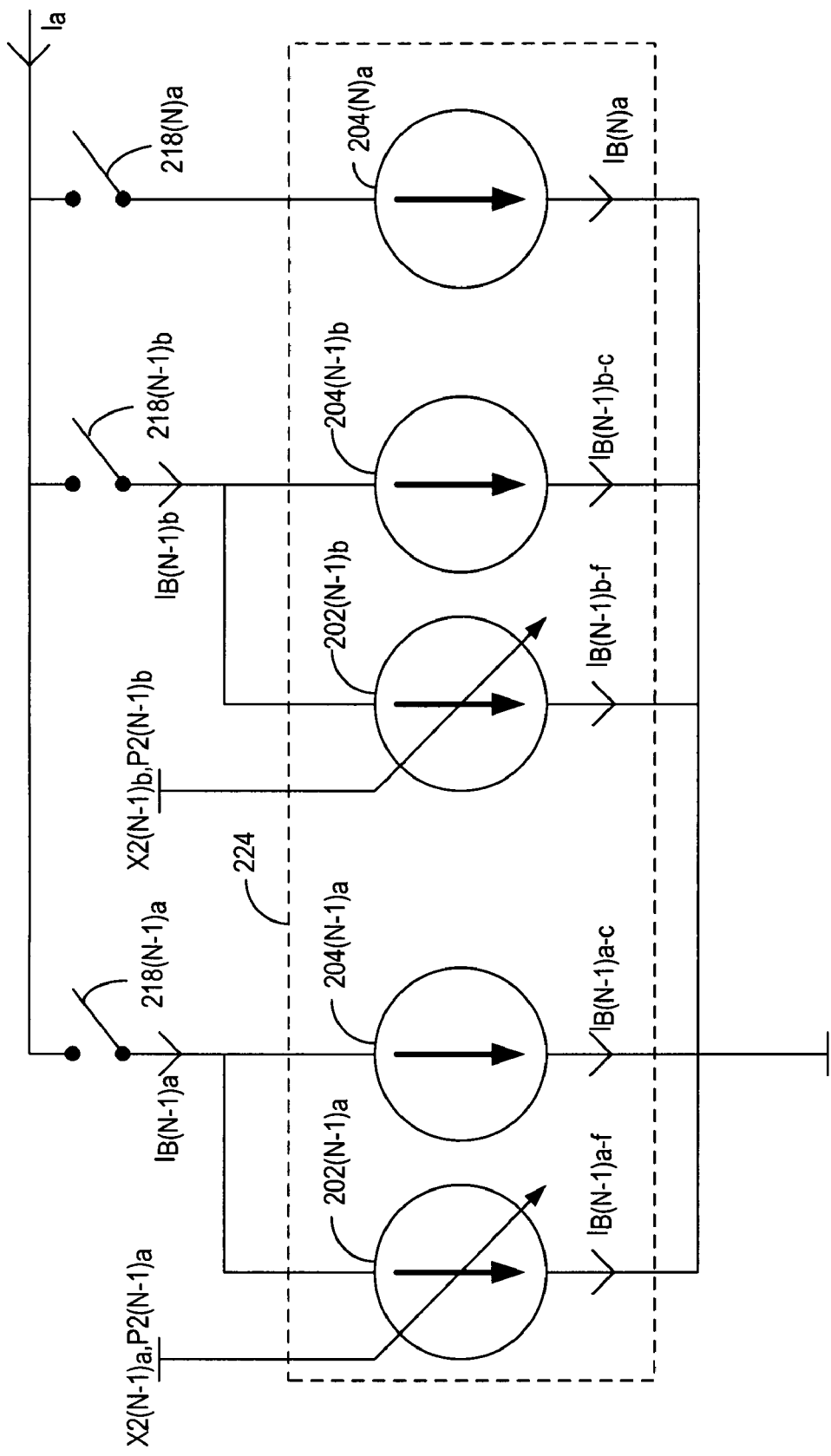
FIG. 2H exemplifies a portion of the schematic diagram of FIG. 2A that is active during the calibration of first and second replica current sinks of the next most significant bit of a set of binary current sources/sinks.

Turning to FIG. 2H, the relevant components active during the sixth calibration step are illustrated, whereby switches $218(N-1)_a$ and $218(N-1)_b$ are closed. In addition, switch $218(N)_a$ is closed so that the previously calibrated current, $I_{B(N)a}$, is included in the current to be fine tuned, $I_a$. The current to be fine tuned, $I_a$, is therefore, composed of the sum of the current generated by current sinks $204(N-1)_a$, $204(N-1)_b$, CALDAC current sinks $202(N-1)_a$, $202(N-1)_b$, and the previously calibrated current sink $204(N)_a$, where the nominal magnitude of the sum of the current is substantially equal to $I_{temp}$. $I_a$ is fine tuned to be substantially equal to $I_{temp}$, as discussed above in relation to current cell 224 of FIG. 2A, through simultaneously adjusting CALDACs $202(N-1)_a$ and $202(N-1)_b$, which results in the following equation within a quantization calibration error:

$$I_{B(N-1)a} + I_{B(N-1)b} + I_{B(N)a} = I_{temp}. \quad (16)$$

From equations (10), (12), (14), and (16), the following relationship may be established:

$$I_{B(N-1)b} = I_{B(N-1)a} = 0.25 * I_{temp}. \quad (17)$$

Thus, after completion of calibration steps four through six, the current conducted by each current sink of current sink replica pair $204(N-1)_a$, $204(N-1)_b$ is calibrated to be substantially equal to $I_{temp}/4$ within a quantization calibration error. The magnitude and polarity of the current produced by CAL-DACs $202(N-1)_a$ and $202(N-1)_b$, as represented by control signals $X2(N-1)_a$, $P2(N-1)_a$ and $X2(N-1)_b$, $P2(N-1)_b$, are then recorded by FSM 212 and later used during calibration of the remaining binary current sinks within self-calibrating current sink 224.

FIGS. 2B-2H graphically illustrate the configuration of self-calibrating current sink 224 and switch matrix 218 for the first 7 steps of the calibration routine. In particular, calibration of thermometer current signal, $I_{thermometer}$, is discussed above in relation to FIG. 2B, calibration of the two replicas of the most-significant binary currents, $I_B(N)_a$ and $I_B(N)_b$, is discussed above in relation to FIGS. 2C-2E, and calibration of the next less-significant binary current signals, $I_B(N-1)_a$ and $I_B(N-1)_b$, is discussed above in relation to FIGS. 2F-2H.

It is appreciated that the calibration routine may progress in a similar fashion to calibrate the remaining binary current sinks. As discussed in more detail below, the calibration routine may be used to calibrate all current-steering DAC architectures that include at least two sets of binary current sinks. Thus, the calibration routine is independent of the particular DAC architecture being calibrated, which may include a segmented architecture, a binary only architecture, or a DAC architecture that is based on parallel sub-DACs.

Turning to FIGS. 3A-3D, for example, various architectures that may utilize the current calibration routine as discussed herein are exemplified. In particular, current-based circuits such as current steering DACs, are implemented through the programmable interconnection of a plurality of parallel current sources/sinks, whose current conduction terminals are coupled through programmable switches to the output bus of the DAC. Each switch is generally coupled in series with each of the parallel-connected current sources/sinks, whereby if the bit that controls the conductivity state of the switch is logically active, then that particular current source adds/subtracts to/from the total current conducted by the output terminal of the DAC.

Figure 3A:
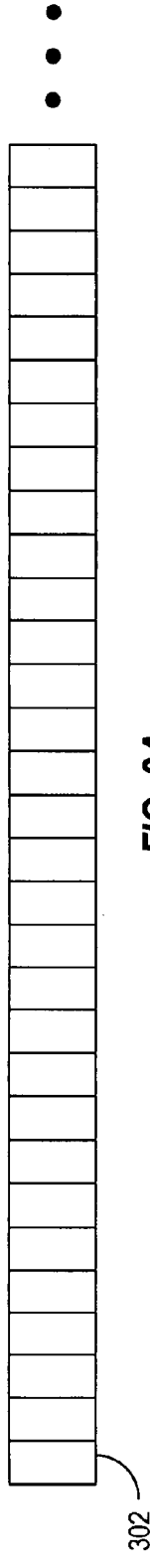
FIG. 3 illustrates various architectures that may utilize the current calibration routine as described for the schematic diagrams of FIGS. 2A-2H.

With respect to DAC architectures, the parallel-connected current sources may be combined into various configurations as illustrated in FIGS. 3A-3D. FIG. 3A exemplifies a thermometer current source/sink architecture, whereby each of current sources/sinks 302 represents unit elements in a parallel configuration. Each thermometer current source/sink 302 nominally produces the same amount of current, thus thermometer current sources/sinks 302 are more conducive to calibration, since only a single current reference is needed to calibrate all current sources/sinks 302. Implementation of thermometer current sources/sinks 302, however, require additional integrated circuit (IC) resources as compared to their binary current source/sink counterparts.

Figure 3B:
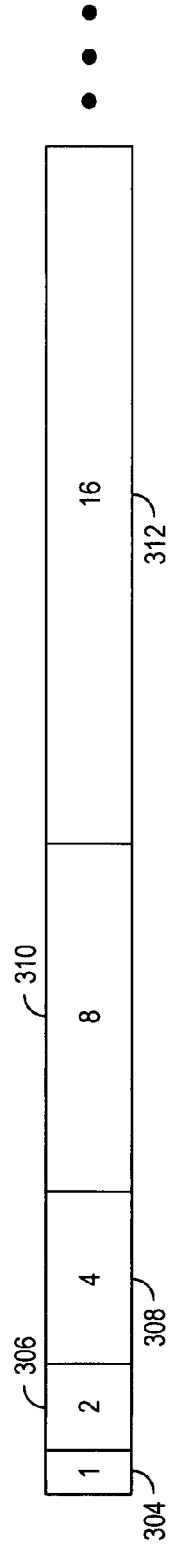

FIG. 3B exemplifies a binary current source/sink architecture, whereby binary current sources/sinks 304-312 do not produce the same amount of current. Instead, each binary current source/sink produces an amount of current that is proportional to its respective binary weighting. For example, binary current source/sink 304 produces an amount of current that is nominally equal to one LSB. Binary current source/sink 306, on the other hand, produces twice the amount of current as compared to binary current source/sink 304, i.e., an amount of current that is nominally equal to two LSBs. Similarly, binary current source/sink 308 produces twice the amount of current produced by binary current source/sink 306, binary current source/sink 310 produces twice the amount of current produced by binary current source/sink 308, and so on in accordance with the binary scale. While the binary architecture of FIG. 3B exhibits increased resource efficiency as compared to the thermometer current source/sink architecture of FIG. 3A, the binary architecture is traditionally more difficult to calibrate, since each binary current source/sink is nominally different than every other binary current source/sink.

Figure 3C:
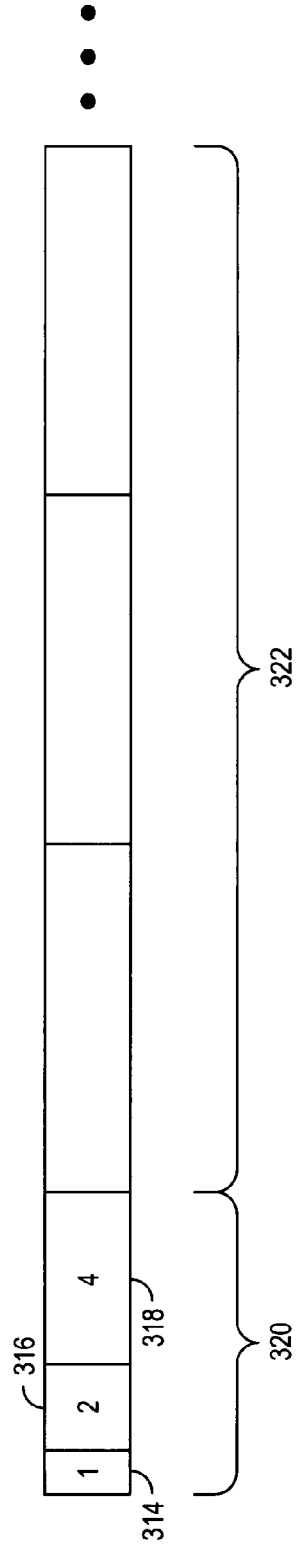

Turning to FIG. 3C, a segmented DAC architecture is exemplified, whereby the most significant bit (MSB) portion of the architecture is implemented using thermometer current sources/sinks 322, while the LSB portion of the DAC architecture is implemented using binary current sources/sinks 320. Thus, advantageous aspects of both the thermometer and binary current sources/sinks may be exploited, whereby thermometer current sources/sinks 322 are used in the MSB portion due to their relative ease of calibration, while binary current sources/sinks 314-318 are used in the LSB portion due to their resource efficiency.

Figure 3D:
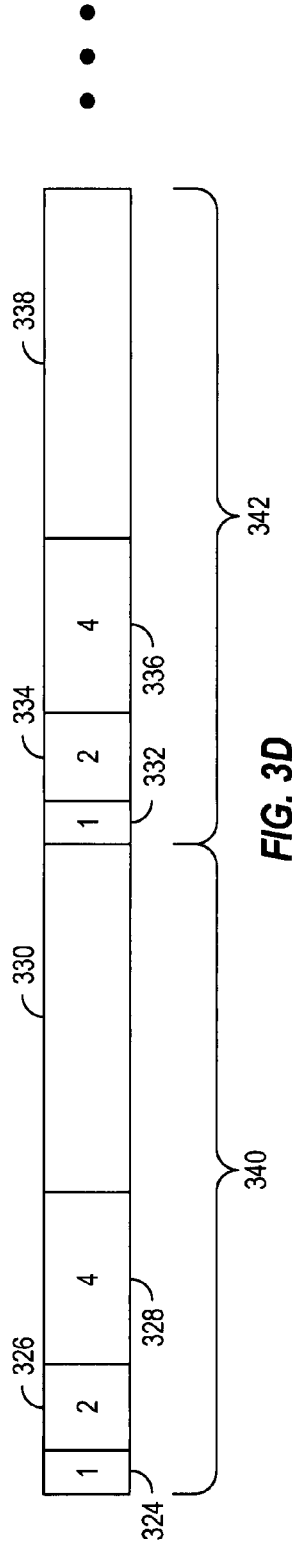

Turning to FIG. 3D, a parallel sub-DAC architecture is exemplified, whereby multiple, sub-DAC architectures 340-342 are combined. The parallel sub-DAC architecture is not limited to segmented sub-DACs because the sub-DACs may also have fully binary architectures, or fully thermometer architectures. In one embodiment, for example, binary current sources/sinks 324-328 and thermometer current sources/sinks 330 may combine to form the LSB and MSB portions, respectively, of segmented sub-DAC 340. Similarly, binary current sources/sinks 332-336 and thermometer current sources/sinks 338 may combine to form the LSB and MSB portions, respectively, of segmented sub-DAC 342.

Alternatively, the parallel sub-DAC architecture of FIG. 3D may be utilized to create two independent, but mutually beneficial DACs. That is to say, for example, that specific signal processing techniques may be applied to nominally identical sub-DACs 340 and 342 to improve the overall DAC performance. Thus, the parallel sub-DAC architecture of FIG. 3D provides flexibility, since each of sub-DACs 340-342 may be effectively coupled in parallel to provide multiple DACs with matched performance. Other advantages of the parallel sub-DAC architecture of FIG. 3D include the controllability of the LSB step current and the DAC resolution. In other words, by connecting sub-DACs 340-342 in parallel, DAC resolution and LSB step current may be adjusted so that performance is optimized based upon the particular DAC implementation.

Figure 4:
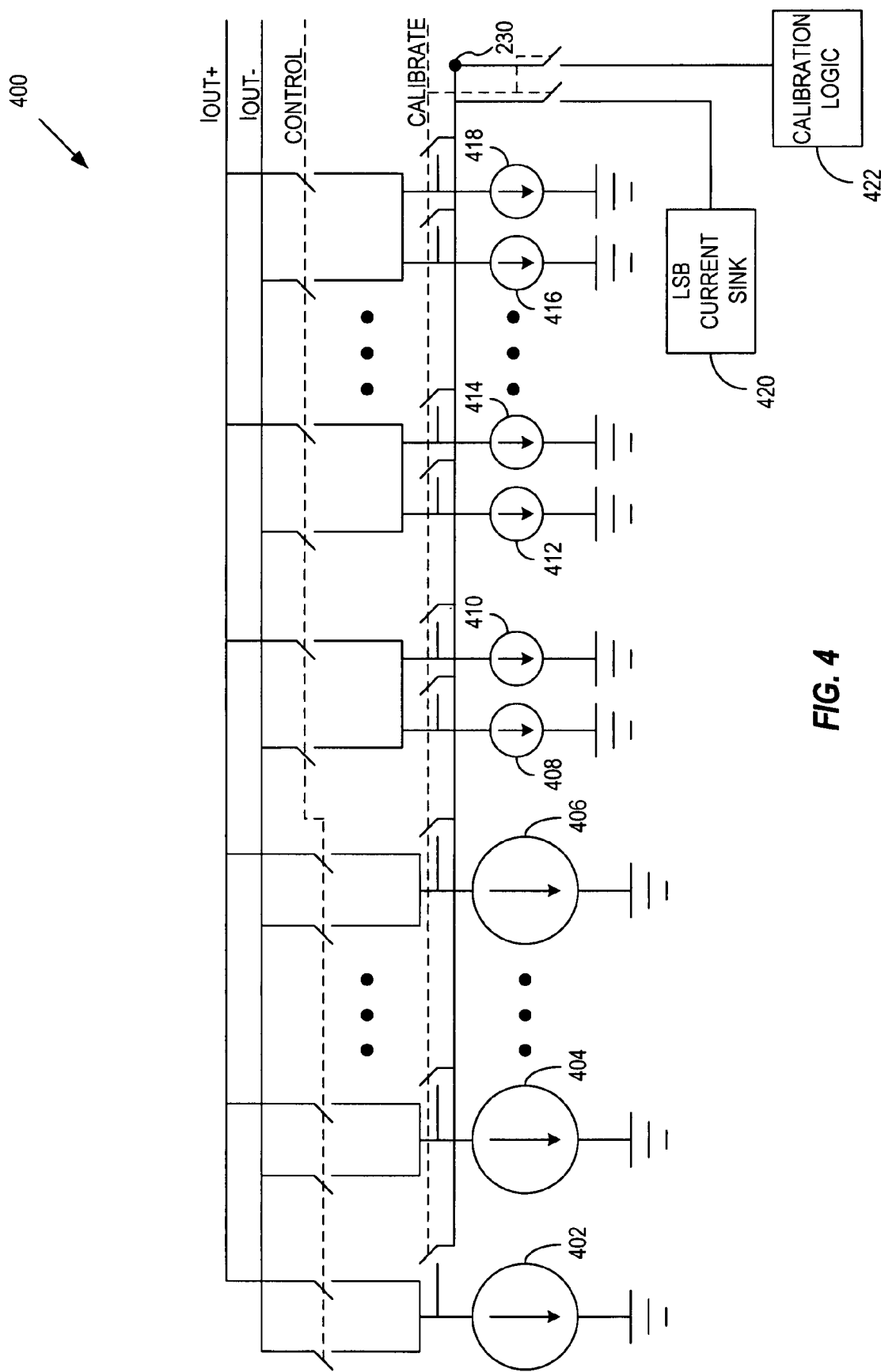
FIG. 4 illustrates an exemplary segmented architecture.

Turning to FIG. 4, a segmented DAC architecture 400 is illustrated, which employs, for example, two sets of binary current sink sets, first binary current sink set 408,412,416, and second binary current sink set 410,414,418. Current sinks 402-418 represent a programmable interconnection of a plurality of current sinks, whose current conduction terminals are coupled through switches to the differential output terminals of the DAC, i.e., $I_{OUT+}$ and $I_{OUT-}$. Each switch is generally coupled in series with each of the parallel-connected current sinks, whereby if a bit within bus CONTROL is logically active, then the corresponding switch causes the corresponding current sink to add/subtract to/from the total current conducted by the output terminals of the DAC.

Current sinks 402-418 are self-calibrating current sinks as described above in relation to FIGS. 2B-2H. In particular, current sinks 402-410 represent self-calibrating thermometer current sinks, whereby thermometer current sinks 408 and 410 are implemented as a replica current sink pair and are sized to nominally conduct half of the current as conducted by thermometer current sinks 402-406. As such, the combination of thermometer current sink pair 408/410 nominally conducts the same amount of current that is conducted by each of thermometer current sinks 402-406 individually.

Current sinks 412-418 represent self-calibrating binary current sinks, whereby binary current sinks 412 and 414 are sized to nominally conduct ¼ of the current as conducted by thermometer current sink pair 408/410. As such, the combination of binary current sink pair 412/414 nominally conducts ½ of the current as conducted by the combination of thermometer current sink pair 408/410. Each binary current sink pair down to binary current sink pair 416/418 is similarly scaled according to a binary weighting function.

Each of current sinks 402-418 may be programmably isolated and individually calibrated to a reference current source during a calibration event as discussed above and as discussed in more detail below. Generally, each of current sinks 402-418 are comprised of a current sink and a CALDAC as discussed above in relation to current source 224 of FIG. 2A. Calibration logic 422, e.g., FSM 212, sign detector 214, current cell 226, switch 216, and current sink 206, may then be programmably coupled to node 230 so that each current cell 402-418 may be individually calibrated.

Figure 5:
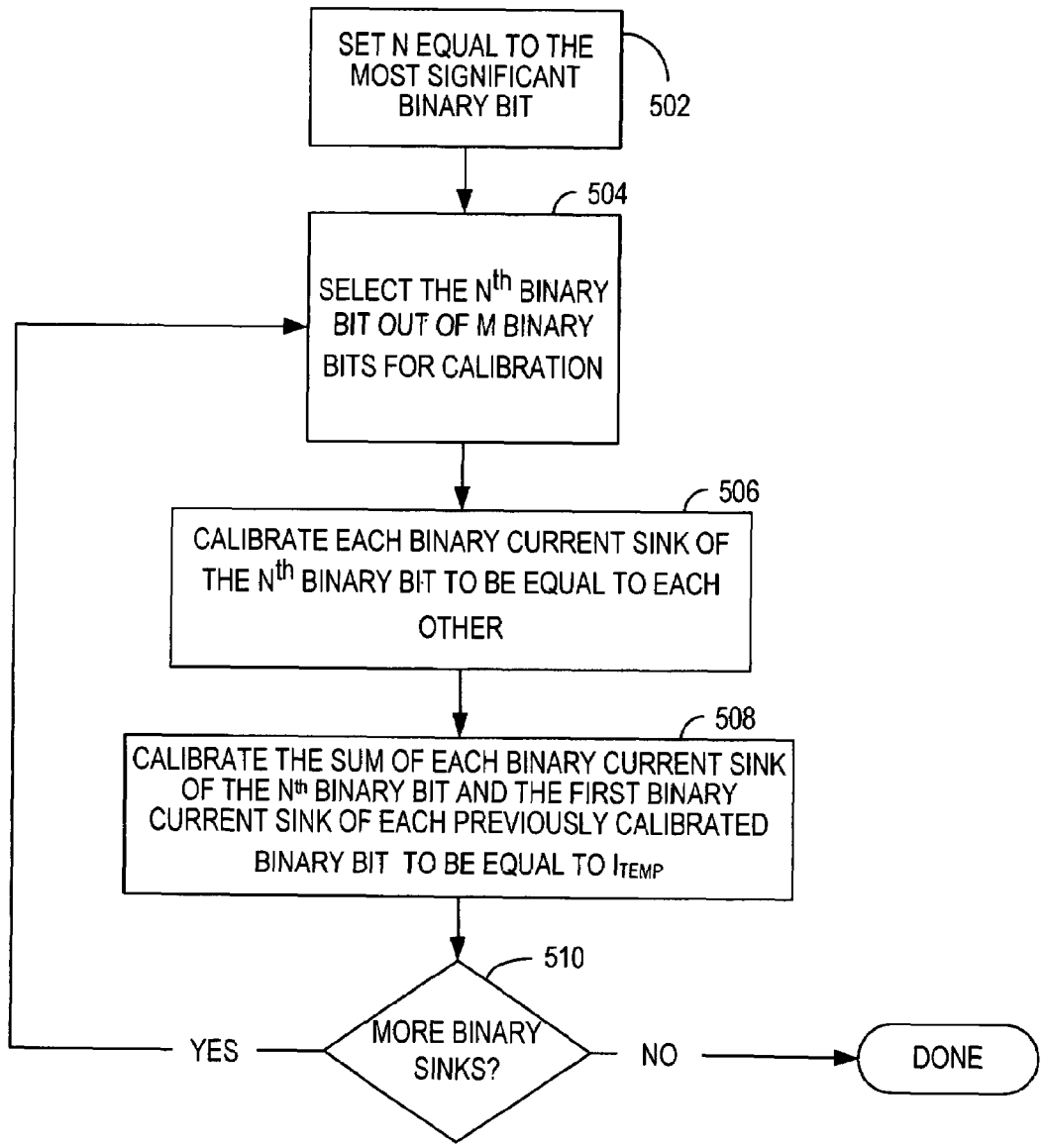
FIG. 5 illustrates an exemplary flow diagram of a current calibration routine.

Turning to FIG. 5, an exemplary calibration method is illustrated, whereby current cells of a binary DAC architecture, a segmented DAC architecture, or a parallel sub-DAC architecture may be calibrated. While the calibration of thermometer current cells is not illustrated in FIG. 5, thermometer current cells of either a thermometer DAC architecture, a segmented DAC architecture, or a parallel sub-DAC architecture may nevertheless be calibrated in accordance with the calibration routine as discussed above in relation to FIG. 2B.

In general, the calibration method as exemplified in FIG. 5 may be employed for any DAC architecture that employs two or more sets of current sources/sinks. Step 502 selects the most significant binary bit, such that the first time that step 504 is executed, the most significant bit of the binary current sources/sinks are to be calibrated. Turning to the DAC architecture of FIG. 4, for example, replica current sinks 408 and 410 are utilized to provide the MSB bit of the binary portion of the segmented DAC. It should be noted, that while the calibration routine of FIG. 5 is described in relation to the DAC architecture of FIG. 4, the calibration routine of FIG. 5 may be applied to any DAC architecture that employs two or more sets of binary current sources/sinks.

Calibration step 506 is executed in multiple steps, whereby each replica current sink of each binary bit is calibrated to be substantially equal to each of the other replica current sinks of the binary bit. Taking DAC architecture 400, for example, two replica current sinks are utilized for each binary bit, thus a two-part calibration step is necessary to complete calibration step 506. Current sink 408, for example, is first calibrated as described by equation (16) and then current sink 410 is calibrated as described by equation (17).

During the first part of calibration step 506, current sink 408 is programmably coupled to node 230 through its corresponding switch by signal CALIBRATE, and current sink 410 is programmably decoupled from node 230 through its corresponding switch by signal CALIBRATE, whereby the calibration condition to be obtained may be described as:

$$I_{408} + \sum_{j=M-1}^{1} I_B(j)_a + 1LSB \cong I_{temp}, \quad (16)$$

where $I_{408}$ is the current that is generated by current sink 408, M is the number of binary bits, and $I_B(j)_a$ is the current that is generated by the first replica current sink of the remaining binary bits, e.g., current sinks 412, 416, etc., which have been coupled to node 230 through their corresponding switches by signal CALIBRATE.

An additional 1 LSB current sink, e.g., LSB current sink 420, is also required so that the substantial equality condition of equation (16) may be met. The substantial equality condition may be understood, when it is recognized that current sink 408, and the remaining current sinks within the summation, have binary scaled current magnitudes that are nominally equal to $I_{temp}/2$, $I_{temp}/4$, $I_{temp}/8$, etc., respectively.

In operation, the CALDAC (not shown) within current sink 408 is fine-tuned, as discussed above in relation to FIG. 2C, until equation (16) is satisfied. In particular, the current provided by current sink 408 is adjusted until the left side of equation (16) is substantially equal to $I_{temp}$ within a quantization error.

During the second part of calibration step 506, current sink 410 is programmably coupled to node 230 through its corresponding switch by signal CALIBRATE, and current sink 408 is programmably decoupled from node 230 through its corresponding switch by signal CALIBRATE, whereby the calibration condition to be obtained may be described as:

$$I_{410} + \sum_{j=M-1}^{1} I_B(j)_a + 1LSB \cong I_{temp}. \quad (17)$$

where $I_{410}$ is the current that is generated by current sink 410, M is the number of binary bits, and $I_B(j)_a$ is the current that is generated by the first replica current sink of the remaining binary bits, e.g., current sinks 412, 416, etc., which have been coupled to node 230 through their corresponding switches by signal CALIBRATE.

In operation, the CALDAC (not shown) within current sink 410 is fine-tuned, as discussed above in relation to FIG. 2D, until equation (17) is satisfied. In particular, the current provided by current sink 410 is adjusted until the left side of equation (17) is substantially equal to $I_{temp}$ within a quantization error.

Thus, it can be seen that after the first and second parts of calibration step 506 have been executed, both current sinks 408 and 410 are calibrated to be substantially equal to each other within a quantization error. It is noted that current sinks 408 and 410 are each being calibrated through the use of a previously calibrated current sink, e.g., current sink 406, which generates a current magnitude that is substantially equal to the post-calibrated current, $I_{temp}$, as discussed above in relation to FIG. 2B.

During calibration step 508, both current sinks 408 and 410 are programmably coupled to node 230 through their corresponding switches by signal CALIBRATE, whereby the calibration condition to be obtained may be described as:

$$I_{408} + I_{410} \cong I_{temp}. \quad (18)$$

Current sinks 408 and 410 are, therefore, fine tuned, as discussed above in relation to FIG. 2E, until the sum of current $I_{408}$ and $I_{410}$ is substantially equal to the post-calibrated current, $I_{temp}$, within a quantization error. Thus, equation (18), when combined with equations (16) and (17), insures that $I_{408}=I_{410}\cong I_{temp}/2$.

If additional binary current sources/sinks require calibration, as determined in step 510, then the next less-significant binary bit is selected. Turning back to the DAC architecture of FIG. 4, for example, the binary bit composed of replica current sinks 412 and 414 is selected for calibration. During the first part of calibration step 506, current sink 408 is programmably coupled to node 230 through its corresponding switch by signal CALIBRATE, current sink 412 is programmably coupled to node 230 through its corresponding switch by signal CALIBRATE, and current sink 414 is programmably decoupled from node 230 through its corresponding switch by signal CALIBRATE, whereby the calibration condition to be obtained may be described as:

$$I_{408} + I_{412} + \sum_{j=M-2}^{1} I_B(j)_a + 1LSB \cong I_{temp}. \quad (19)$$

$I_{408}$ is the previously calibrated current signal that is generated by current sink 408, $I_{412}$ is the current signal that is generated by current sink 412, and M is the number of binary bits. $I_B(j)_a$ is the current that is generated by the first replica current sink of the remaining binary bits, e.g., current sinks 416, etc., which have been coupled to node 230 through their corresponding switches by signal CALIBRATE.

In operation, the CALDAC (not shown) within current sink 412 is fine tuned, as discussed above in relation to FIG. 2F, until equation (19) is satisfied. In particular, the current provided by replica current sink 412 is adjusted until the left side of equation (19) is substantially equal to $I_{temp}$ within a quantization error.

During the second part of calibration step 506, current sink 408 is programmably coupled to node 230 through its corresponding switch by signal CALIBRATE, current sink 414 is programmably coupled to node 230 through its corresponding switch by signal CALIBRATE, and current sink 412 is programmably decoupled from node 230 through its corresponding switch by signal CALIBRATE, whereby the calibration condition to be obtained may be described as:

$$I_{408} + I_{414} + \sum_{j=M-2}^{1} I_B(j)_a + 1LSB \cong I_{temp}. \quad (20)$$

$I_{408}$ is the previously calibrated current signal that is generated by current sink 408, $I_{414}$ is the current signal that is generated by current sink 414, and M is the number of binary bits. $I_B(j)_a$ is the current that is generated by the first replica current sink of the remaining binary bits, e.g., current sinks 416, etc., which have been coupled to node 230 through their corresponding switches by signal CALIBRATE.

In operation, the CALDAC (not shown) within current sink 414 is fine-tuned, as discussed above in relation to FIG. 2G, until equation (20) is satisfied. In particular, the current provided by current sink 414 is adjusted until the left side of equation (20) is substantially equal to $I_{temp}$ within a quantization error.

Thus, it can be seen that after the first and second parts of calibration step 506 have been executed, both replica current sinks 412 and 414 are calibrated to be substantially equal to each other within a quantization error. It is noted that replica current sinks 412 and 414 are each being calibrated through the use of previously calibrated current sink, e.g., current sink 406, and previously calibrated replica current sink 408.

During calibration step 508, current sink 408 is programmably coupled to node 230 through its corresponding switch by signal CALIBRATE and both current sinks 412 and 414 are programmably coupled to node 230 through their corresponding switches by signal CALIBRATE, whereby the calibration condition to be obtained may be described as:

$$I_{408}+I_{412}+I_{414}\cong I_{temp}. \quad (21)$$

The sum of current generated by current sinks 412, 414 and 408 are, therefore, fine tuned, as discussed above in relation to FIG. 2H, until the sum of current $I_{408}$, $I_{412}$, and $I_{414}$ is substantially equal to the post-calibrated current, $I_{temp}$, within a quantization error. Thus, equation (21), when combined with equations (19) and (20), insures that $I_{412}=I_{414}\cong I_{temp}/4$. If more binary current sinks exist within the DAC architecture, as determined in step 510, then the next less-significant binary current sink is selected as in step 504 and the calibration continues as in steps 506 and 508 until all binary current sinks are calibrated.

If a multiple DAC architecture, such as the parallel sub-DAC architecture of FIG. 3D is being calibrated, then there is no need to implement replica current sinks as exemplified in FIG. 4. Instead, replica sinks are inherently implemented, whereby for example, current sink 324 is the replica of current sink 332, current sink 326 is the replica of current sink 334, and so on. Thus, it can be seen that the calibration routine as discussed above in relation to FIG. 5 may be readily applied to the parallel sub-DAC architecture of FIG. 3D.

It should be noted that the only contribution to quantization error in the calibration process as described above relates to the step size used by each CALDAC. Thus, the quantization error may be reduced further by simply reducing the step size of each CALDAC. Reduction of the quantization error, for example, during calibration of the least significant binary current sinks may be desired, since the quantization error is more significant, i.e., the quantization error constitutes a higher percentage of nominal current produced by the least significant binary current cells.

The present method for calibration of current sinks/sources can be applied to all DAC architectures that are shown in FIGS. 3A-3D. Considering the DAC architecture of FIG. 3A, for example, only the nominally identical thermometer current sources are calibrated, as discussed above in relation to FIG. 2B. Conversely, the DAC architectures of FIGS. 3B and 3C may be calibrated as discussed above in relation to FIGS. 4-5.

Considering the parallel sub-DAC architecture of FIG. 3D, on the other hand, the method exemplified in FIG. 5 may be directly applied, because at least two binary current sink sets, e.g., 340 and 342, are inherently implemented. That is to say, for example, that the most significant binary bit, as determined in step 502 of FIG. 5, relates to binary current sinks 328 and 336 of FIG. 3D. Current sinks 328 and 336 are, therefore, considered as replica current sink pairs and are calibrated as discussed above in relation to steps 506 and 508 of FIG. 5. The remaining replica current sink pairs 326,324 and 324,332 may similarly be calibrated in accordance with steps 506 and 508 of FIG. 5.

It should be noted that if a third parallel sub-DAC exists within FIG. 3D, then replica current sink triplets would be calibrated. Similarly, if a fourth parallel sub-DAC exists within FIG. 3D, then replica current sink quadruplets would be calibrated, and so on. Thus, the calibration routine as discussed herein may be modified to calibrate any number of binary current sink sets as required.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A self-calibrating digital to analog converter, comprising:
   two or more sets of programmable current cells programmably coupled to a first node;
   a temporary current cell programmably coupled to the first node;
   a least significant bit current cell programmably coupled to the first node; and
   a calibration logic block programmably coupled to the first node.

2. The self-calibrating digital to analog converter of claim 1, wherein the two or more sets of programmable current cells comprise a plurality of self-calibrating current cells, each of the plurality of self-calibrating current cells being adapted to conduct a programmable current magnitude.

3. The self-calibrating digital to analog converter of claim 2, wherein each of the plurality of self-calibrating current cells comprise:
   a current sink adapted to conduct a fixed current magnitude from the first node; and
   a first programmable current conduction device adapted to generate a programmable current magnitude having a programmable polarity at the first node.

4. The self-calibrating digital to analog converter of claim 3, wherein the temporary current cell comprises:
   a current source adapted to conduct a fixed current magnitude into the first node; and
   a second programmable current conduction device adapted to generate a programmable current magnitude having a programmable polarity at the first node.

5. The self-calibrating digital to analog converter of claim 4, wherein the calibration logic block comprises:
   a reference current cell programmably coupled to the first node;
   a sign detector coupled to the first node; and
   a finite state machine coupled to an output of the sign detector, the finite state machine adapted to adjust the programmable current magnitude and the programmable current polarity of the first and second programmable current conduction devices in response to the output of the sign detector.

6. The self-calibrating digital to analog converter of claim 1, wherein the two or more sets of programmable current cells are implemented as two or more binary digital to analog converters coupled in parallel.

7. The self-calibrating digital to analog converter of claim 6, wherein a magnitude of current conducted by the temporary current cell is substantially equal to a magnitude of current conducted by a most significant bit of the two or more binary digital to analog converters.

8. The self-calibrating digital to analog converter of claim 1, wherein the two or more sets of programmable current cells are configured as two or more segmented digital to analog converters coupled in parallel, each segmented digital to analog converter including one or more thermometer current cells and one or more binary current cells.

9. The self-calibrating digital to analog converter of claim 8, wherein a magnitude of current conducted by the temporary current cell is substantially equal to a magnitude of current conducted by one of the one or more thermometer current cells.

10. A current calibration method, comprising:
    configuring at least two current cells from at least two sets of current cells to form at least one group of replica current cells;
    adjusting a magnitude of current generated by each current cell in the at least one group of replica current cells to be substantially equal to each other; and
    adjusting a magnitude of current generated by each of the at least one group of replica current cells to be substantially equal to a portion of a temporary current magnitude.

11. The current calibration method of claim 10, wherein adjusting a magnitude of current generated by each current cell in the at least one group of replica current cells comprises:
    programmably coupling a least significant bit current cell to a calibration node;
    programmably coupling a current cell from each group of replica current cells to the calibration node; and
    programmably coupling a temporary current cell to the calibration node, wherein the temporary current cell generates the temporary current magnitude.

12. The current calibration method of claim 11, wherein adjusting a magnitude of current generated by each current cell in the at least one group of replica current cells further comprises:
    adjusting a magnitude of current generated by one of the programmably coupled current cells to be substantially equal to a difference between the temporary current magnitude and a sum of current conducted by the remaining programmably coupled current cells; and
    programmably decoupling the current cell from each group of replica current cells from the calibration node.

13. The current calibration method of claim 12, wherein adjusting a magnitude of current generated by each of the at least one group of replica current cells comprises:
    identifying a group of replica current cells to calibrate;
    programmably coupling each current cell of the identified group of replica current cells to the calibration node; and
    programmably coupling one current cell of previously calibrated groups of replica current cells to the calibration node to form a previously calibrated current.

14. The current calibration method of claim 13, wherein adjusting a magnitude of current generated by each of the at least one group of replica current cells further comprises adjusting a sum of the current generated by the identified group of replica current cells with the previously calibrated current to be substantially equal to the temporary current magnitude.

15. A method of calibrating binary current cells within a digital to analog converter comprising:
    configuring at least two binary current cells from at least two sets of binary current cells to form at least one group of replica binary current cells, each group of replica binary current cells forming a binary weighted bit of the digital to analog converter;
    adjusting a magnitude of current generated by each binary current cell in the at least one group of replica binary current cells to be substantially equal to each other; and
    adjusting a magnitude of current generated by each of the at least one group of replica binary current cells to be substantially equal to a portion of a temporary current conducted by a previously calibrated temporary current cell.

16. The method of claim 15, wherein adjusting a magnitude of current generated by each binary current cell in the at least one group of replica binary current cells comprises:
   programmably coupling a least significant bit binary current cell to a calibration node;
   programmably coupling a binary current cell from each group of replica binary current cells to the calibration node; and
   programmably coupling the previously calibrated temporary current cell to the calibration node.

17. The method of claim 16, wherein adjusting a magnitude of current generated by each binary current cell in the at least one group of replica binary current cells further comprises:
   adjusting a magnitude of current generated by one of the programmably coupled binary current cells to be substantially equal to a difference between the temporary current and a sum of current conducted by the remaining programmably coupled binary current cells; and
   programmably decoupling each of the programmably coupled binary current cells from the calibration node.

18. The method of claim 17, wherein adjusting a magnitude of current generated by each of the at least one group of replica binary current cells comprises:
   identifying a group of replica binary current cells to calibrate;
   programmably coupling each binary current cell of the identified group of replica binary current cells to the calibration node; and
   programmably coupling one binary current cell of previously calibrated groups of replica binary current cells to the calibration node to form a previously calibrated current.

19. The method of claim 18, wherein adjusting a magnitude of current generated by each of the at least one group of replica binary current cells further comprises adjusting a sum of the current generated by the identified group of replica binary current cells with the previously calibrated current to be substantially equal to the temporary current.

20. The method of claim 15, wherein the temporary current cell is previously calibrated to be substantially equal to a magnitude of current conducted by a thermometer current cell of the digital to analog converter.

* * * * *